United States Patent
Choi

(10) Patent No.: US 7,554,859 B2
(45) Date of Patent: *Jun. 30, 2009

(54) NONVOLATILE MEMORY SYSTEM AND ASSOCIATED PROGRAMMING METHODS

(75) Inventor: Jin-Hyeok Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 107 days.

This patent is subject to a terminal disclaimer.

(21) Appl. No.: 11/730,265

(22) Filed: Mar. 30, 2007

(65) Prior Publication Data

US 2008/0074928 A1 Mar. 27, 2008

(30) Foreign Application Priority Data

Sep. 22, 2006 (KR) .................. 10-2006-0092472

(51) Int. Cl.
*G11C 7/10* (2006.01)
(52) U.S. Cl. .................. 365/189.05; 365/185.03; 365/185.11; 365/238.5
(58) Field of Classification Search ............ 365/185.22, 365/185.11, 185.03, 238.5, 189.05
See application file for complete search history.

(56) References Cited

U.S. PATENT DOCUMENTS 5,107,457 A * 4/1992 Hayes et al. ............... 711/132
6,608,784 B2 8/2003 Kanamori et al.
6,735,116 B2 * 5/2004 Lee et al. ............... 365/185.17
7,420,847 B2 * 9/2008 Li ........................ 365/185.22
2003/0163629 A1 * 8/2003 Conley et al. ............... 711/103
2006/0126394 A1 6/2006 Li
2007/0035995 A1 * 2/2007 Crippa et al. .......... 365/185.03

FOREIGN PATENT DOCUMENTS

| JP | 2002334586 A | 11/2002 |
|----|---|---|
| JP | 2004-220068 | 8/2004 |
| KR | 1020000048015 A | 7/2000 |
| KR | 1020020057055 A | 7/2002 |
| KR | 1020050007653 A | 1/2005 |
| KR | 1020060107689 A | 10/2006 |

* cited by examiner

*Primary Examiner*—Son Dinh
*Assistant Examiner*—R Lance Reidlinger
(74) *Attorney, Agent, or Firm*—Volentine & Whitt, PLLC

(57) ABSTRACT

A nonvolatile memory system includes a host system, a memory controller, and a flash memory chip including multi-level flash memory cells. The memory controller includes a backup memory adapted to store a backup copy of previously programmed data from the multi-level flash memory cells when the multi-level flash memory cells are further programmed. Where an error or malfunction occurs during the further programming of the multi-level flash memory cells, the backup copy of the previously programmed data is used to program different multi-level flash memory cells.

34 Claims, 8 Drawing Sheets

Fig. 4
(PRIOR ART)
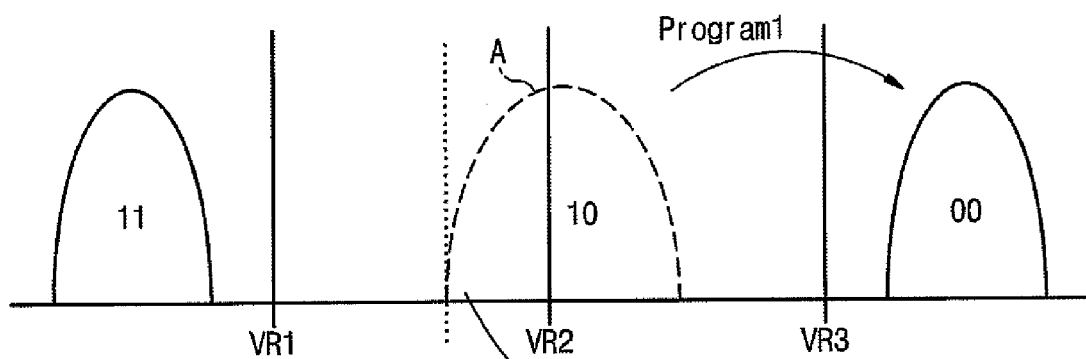
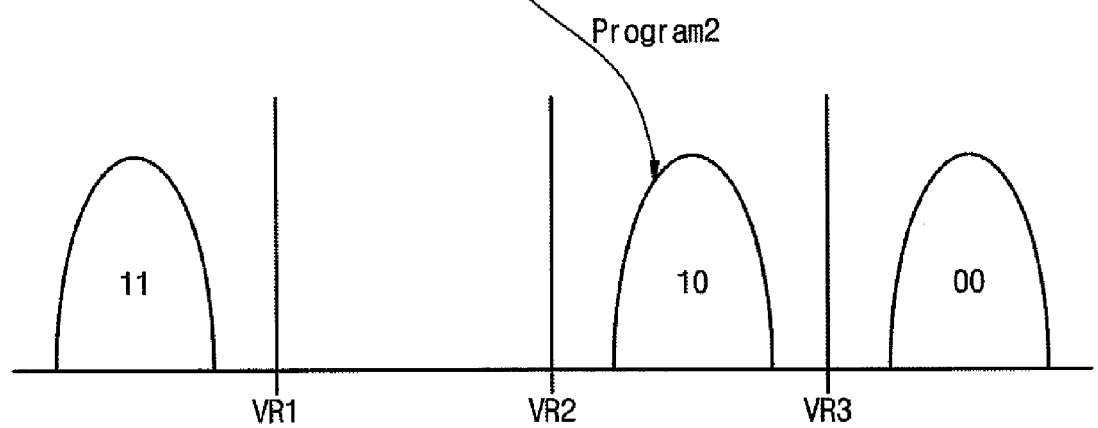
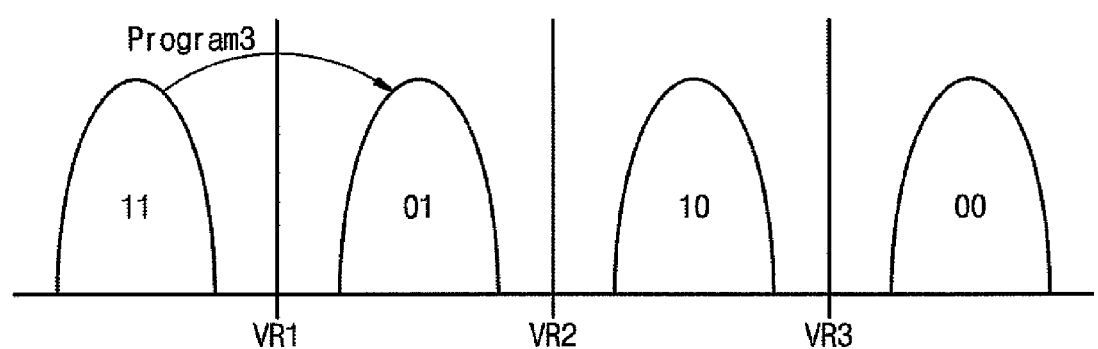

Fig. 5
(PRIOR ART)
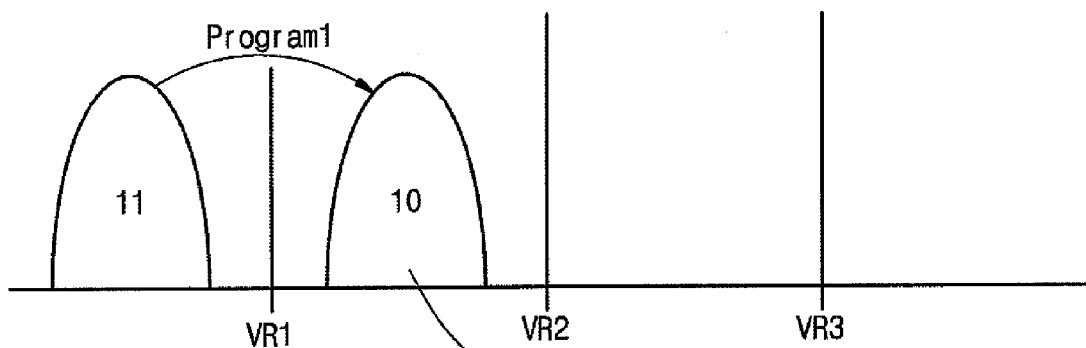
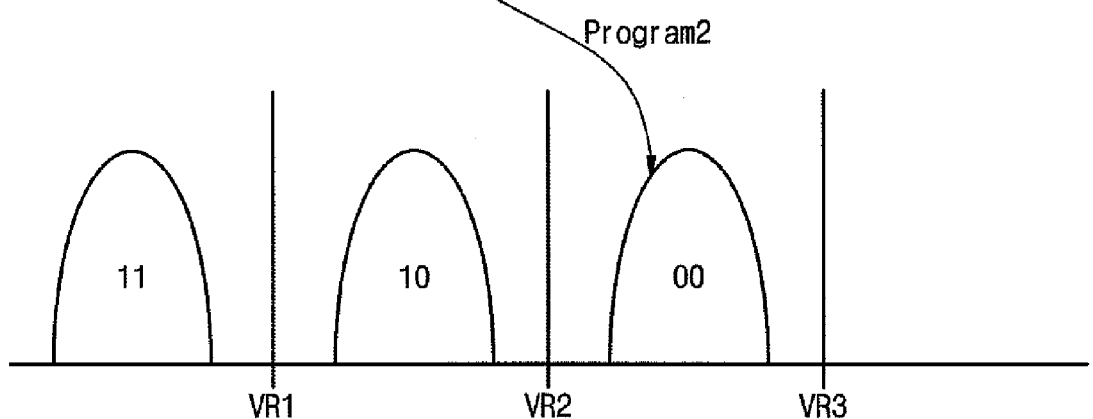
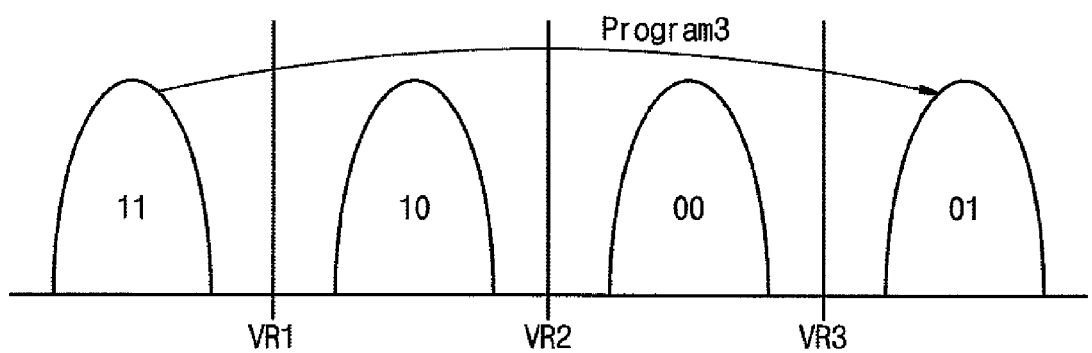

NONVOLATILE MEMORY SYSTEM AND ASSOCIATED PROGRAMMING METHODS

CROSS REFERENCE TO RELATED APPLICATION

This application claims priority to Korean Patent Application No. 10-2006-0092472 filed Sep. 26, 2006, the subject matter of which is hereby incorporated by reference.

BACKGROUND OF THE INVENTION

1. Field of the Invention

Embodiments of the invention relate generally to nonvolatile semiconductor memory systems. More particularly, embodiments of the invention relate to nonvolatile semiconductor memory systems including multi-level nonvolatile memory cells and methods for programming the multi-level nonvolatile memory cells.

2. Description of Related Art

Nonvolatile memory systems are commonly employed in a wide variety of consumer and industrial electronic applications. Common examples of such applications include cellular telephones, personal digital assistants (PDAs), MP3 players, digital cameras, portable disk drives, portable media players (PMPs), and auxiliary memories such as the basic input/output system (BIOS) for personal computers, to name but a few.

Due to the widespread use of nonvolatile memory systems, there continues to be an increasing demand for nonvolatile memory systems having higher data storage capacity and higher overall performance. As a result, researchers are continually striving to find new ways to store more data per memory chip unit area within nonvolatile memory systems.

The use of multi-level nonvolatile memory cells is one technique that has been adopted to increase the amount of stored data per unit memory chip area in nonvolatile memory systems. A multi-level nonvolatile memory cell is a capable of storing more than one bit of data. Accordingly, multi-level nonvolatile memory cells are often interchangeably referred to as multi-bit nonvolatile memory cells.

A typical example of a multi-level nonvolatile memory cell is a multi-level flash memory cell. In general, flash memory cells store data in relation to distinct threshold voltage distributions. In other words, when a different data value is programmed within a flash memory cell, the threshold voltage of the flash memory cell changes from within one threshold voltage distribution to within another threshold voltage distribution.

For instance, (FIG.) 1 illustrates two distinct threshold voltage distributions used to store data in a single level flash memory cell. In the example of FIG. 1, where the single level flash memory cell has a threshold voltage within a threshold voltage distribution labeled "1", the single level flash memory cell stores a logical "1". Otherwise, where the single level flash memory cell has a threshold voltage within a threshold voltage distribution labeled "0", the single level flash memory cell stores a logical "0". Accordingly, the logic state of single bit stored in the single level flash memory cell can be determined by applying a read voltage Vread to a control gate of the single level flash memory cell and determining whether the threshold voltage of the single level flash memory cell is above or below read voltage Vread.

Similarly, FIG. 2 illustrates four distinct threshold voltage distributions used to store data in a multi-level flash memory cell. In particular, the multi-level flash memory cell of FIG. 2 is capable of storing two bits of data, as indicated by the labels on the four threshold voltage distributions. In other words, where the multi-level flash memory cell of FIG. 2 has a threshold voltage within a threshold voltage distribution labeled "11", the multi-level flash memory cell stores a logical "11" (i.e., most significant bit (MSB) "1" and least significant bit (LSB) "1"), where the multi-level flash memory cell has a threshold voltage within a threshold voltage distribution labeled "10", the multi-level flash memory cell stores a logical "10", where the multi-level flash memory cell has a threshold voltage within a threshold voltage distribution labeled "01", the multi-level flash memory cell stores a logical "01", and where the multi-level flash memory cell has a threshold voltage within a threshold voltage distribution labeled "00", the multi-level flash memory cell stores a logical "00".

FIG. 3 illustrates an exemplary nonvolatile memory system including a flash memory comprising multi-level flash memory cells.

Referring to FIG. 3, an exemplary nonvolatile memory system 100 comprises a host 110, a memory controller 120, and a flash memory 130. Among other things, memory controller 120 comprises a buffer memory 121 and flash memory 130 comprises a memory cell array 131 and a page buffer 132.

In memory controller 120, buffer memory 121 temporarily stores data to be programmed in flash memory 130 during program operations. Buffer memory 121 also temporarily stores data read from flash memory 130 during read operations. Buffer memory 121 operates under the control of memory controller 120 and transfers data from host 110 and to flash memory 130 during program operations, and transfers data from flash memory 130 and to host 110 during read operations.

In flash memory 130, memory cell array 131 stores programmed data. Page buffer 132 temporarily stores data to be programmed in memory cell array 131 in program operations and data read from memory cell array 131 in read operations. Memory cell array 131 comprises a plurality of multi-bit nonvolatile memory cells arranged in rows and columns. As an example, cell array 131 may comprise a NAND flash memory array including NAND flash memory cells arranged in a plurality of NAND strings. Typically, the columns of memory cell array 131 are connected to corresponding bit-lines and the rows are connected to corresponding wordlines.

Each row of multi-bit nonvolatile memory cells connected to the same wordline in memory cell array 131 corresponds to one or more pages of data storage. Typically, though not necessarily, programming and read operations are performed on memory cell array 131 one page at a time. As an example, a page of data to be programmed in memory cell array 131 is first transferred to page buffer 132. Then, appropriate voltages are applied to a wordline and bitlines corresponding to a row of memory cells to be programmed in memory cell array 131, based on the page of data stored in page buffer 132.

Where the memory cells in the row are multi-bit memory cells, each row of nonvolatile memory cells connected to the same wordline in memory cell array 131 will correspond to more than one page of data storage. For instance, a row of 2-bit nonvolatile memory cells will correspond to two pages of data. In particular, the two pages, which can be independently programmed, correspond to a least significant bit (LSB) page and a most significant bit (MSB) page because they correspond to LSB and MSB data of the respective 2-bit memory cells, respectively.

In a program operation of nonvolatile memory system 100, host 110 sends a program command and associated program data to memory controller 120. Memory controller 120 receives the program command and the program data and stores the program data in buffer memory 121. In response to the program command, memory controller 120 then controls flash memory 130 to load the program data from buffer memory 121 into page buffer 132. Memory controller 120 then further controls flash memory 130 to program the program data into selected memory cells of memory cell array 131. The location of the selected memory cells in memory cell array 131 where the program data is programmed is typically specified by a program address provided to memory controller 120 by host 110 together with the program command. Usually, flash memory 130 includes row and column decoders that can be used to select appropriate bitlines and wordlines in memory cell array 131 for the program operation based on the program address.

In a read operation of nonvolatile memory system 100, host 110 sends a read command to memory controller 120. In response to the read command, memory controller 120 controls flash memory 130 to transfer read data stored in selected memory cells of memory cell array 131 to page buffer 132. Memory controller 120 then further controls flash memory 130 to transfer the read data from page buffer 132 to buffer memory 121. Finally, memory controller 120 controls buffer memory 121 to transfer the read data from buffer memory 121 to host 110. Similar to the program operation, the location of the selected memory cells of memory cell array 131 is typically specified by a read address provided to memory controller 120 by host 110 together with the read command. Likewise, flash memory 130 generally uses row and column decoders to select appropriate bitlines and wordlines of memory cell 131 for the read operation based on the read address.

Following a program operation, memory controller 120 typically controls flash memory 130 to perform a program-verify operation. The program-verify operation is similar to a read operation, except that the purpose of the program-verify. operation is to determine whether selected memory cells have been successfully programmed. In the program-verify operation, program-verify data is transferred from selected memory cells that were programmed in the program operation, to page buffer 132. Page buffer 132 temporarily stores the program-verify data and the program verify data is compared to program data still stored in buffer memory 121. Where the program data stored in buffer memory 121 is not the same as the program-verify data in page buffer 132, the selected memory cells have not been successfully programmed. Otherwise, where the program data stored in buffer memory 121 is the same as the program-verify data in page buffer 132, the selected memory cells have been successfully programmed. Where the selected memory cells have not been successfully programmed, these memory cells are then either re-programmed with the program data stored in buffer memory 121 or the program data is programmed in a new location of memory cell array 131, such as a different page or a different block.

FIGS. 4 and 5 illustrate different methods that can be used to program a nonvolatile memory system such as that illustrated in FIG. 3. In particular, the methods of FIGS. 4 and 5 are examples of methods for programming nonvolatile memory systems including 2-bit memory cells. In these and other examples, the correspondence between logic states and threshold voltages can be rearranged. For instance, in FIGS. 4 and 5, logic states are assigned to threshold voltages in a non-gray-coded and gray-coded order, respectively. In addition, the order in which respective bits are programmed can also be varied. For instance, although FIGS. 4 and 5 illustrate programming a LSB before programming a MSB, a MSB could alternatively be programmed before the LSB. Moreover, a variety of other programming variations are known in the art and will therefore not be described in detail.

Referring to FIG. 4, a programmed state of a multi-bit nonvolatile memory cell is characterized in relation to five different threshold voltage distributions. Four of these five threshold voltage distributions correspond to respective logic states "11", "01", "10", and "00", and one threshold voltage distribution corresponds to an intermediate programming state, denoted by a dotted arc. In this example, logic state "11" corresponds to an erased state of the multi-bit nonvolatile memory cell, and logic states "01", "10", and "00" correspond to programmed states of the multi-bit nonvolatile memory cell.

In the method illustrated in FIG. 4, the memory cell is initially in the erased state. From the erased state, a LSB of the memory cell is programmed first, followed by a MSB of the memory cell. In programming the LSB, if the LSB to be programmed in the memory cell is a logical "0", the method changes the memory cell from logic state "11" to the intermediate programming state, as indicated by an arrow labeled "Program0". Otherwise, the memory cell remains in logic state "11". Next in programming the MSB, if the MSB to be programmed in the memory cell is a logical "0", the method changes the memory cell from the intermediate programming state to logic state "00" as indicated by an arrow labeled "Program1", or from logic state "11" to logic state "01" as indicated by an arrow labeled "Program3", depending on the logic state of the LSB. Otherwise, where the MSB to be programmed in the memory cell is a logical "1", the method changes the memory cell from the intermediate programming state to logic state "10" as indicated by an arrow labeled "Program2", or maintains the memory cell in logic state "11", depending on the logic state of the LSB.

Referring to FIG. 5, a programmed state of a multi-bit nonvolatile memory cell is characterized in relation to four different threshold voltage distributions. The four threshold voltage distributions correspond to respective logic states "11", "10", "00", and "01". In this example, logic state "11" corresponds to an erased state of the multi-bit nonvolatile memory cell, and logic states "10", "00", and "01" correspond to programmed states of the multi-bit nonvolatile memory cell.

In the method illustrated in FIG. 5, the memory cell is initially in the erased state. From the erased state, a LSB of the memory cell is programmed first, followed by a MSB of the memory cell. In programming the LSB, if the LSB to be programmed in the memory cell is a logical "0", the method changes the memory cell from logic state "11" to logic state "10" as indicated by an arrow labeled "Program1". Otherwise, the memory cell remains in logic state "11". Next in programming the MSB, if the MSB to be programmed in the memory cell is a logical "0", the method changes the memory cell from logic state "10" to logic state "00" as indicated by an arrow labeled "Program2", or from logic state "11" to logic state "01" as indicated by an arrow labeled "Program3", depending on the logic state of the LSB. Otherwise, if the MSB to be programmed in the memory cell is a logical "1", the memory cell remains in logic state "10" or logic state "11", depending on the logic state of the LSB.

In general, when the programming methods illustrated in FIGS. 4 and 5 are performed, the LSB and the MSB of the memory cell will not always be programmed in immediate succession. Instead, for example, the LSB of the memory cell may be programmed first, followed by programming operations for memory cells in different rows of the memory cell array, and then the MSB of the memory cell may be programmed next. Accordingly, the logic state of the LSB must generally be ascertained, e.g., by reading the memory cell before the MSB of the memory cell can be programmed so that the threshold voltage of the memory cell can be changed to within the correct threshold voltage distribution.

Unfortunately, however, if an error or malfunction occurs during programming of the MSB, the LSB may be permanently lost. For instance, if MSB programming is performed on the memory cell as indicated by the arrow labeled "Program3" in FIG. 5 and the MSB programming stops short of threshold voltage distribution corresponding to logic state "01", it may be impossible to determine, based on a simple inspection of the memory cell, whether the LSB of the memory cell was a logical "1" or a logical "0". Fortunately, in such cases, the MSB data can generally be recovered from buffer memory 121. However, the loss of the LSB data may ultimately cripple the performance of nonvolatile memory system.

This problem becomes increasingly important as researchers continue striving to fit more and more data storage capacity within a limited chip area of nonvolatile memory devices, because as the integration density of nonvolatile memory chips increases, the likelihood of errors and malfunctions in programming operations tends to increase accordingly. As a result, it would be beneficial to effectively address problems such as the above described data loss problem in multi-level cells caused by programming errors or malfunctions.

SUMMARY OF THE INVENTION

In recognition of at least the above described problems, embodiments of the invention provide nonvolatile memory systems including memory controllers having backup memories. The backup memories allow the memory controllers to store data that has been previously programmed in multi-level memory cells of the nonvolatile memory systems before further programming the memory cells. By storing the previously programmed data, the backup memories prevent this data from being lost if errors or malfunctions occur during the further programming of the memory cells.

According to one embodiment of the invention, a nonvolatile memory system comprises a memory array and a memory controller. The memory array comprises a plurality of multi-bit nonvolatile memory cells, and the memory controller comprises a buffer memory and a backup memory. The buffer memory is adapted to store j-bit data to be programmed in selected memory cells among the plurality of multi-bit nonvolatile memory cells, and the backup memory is adapted to store i-bit data previously programmed in the selected memory cells before the j-bit data is programmed in the selected memory cells.

According to another embodiment of the invention, a nonvolatile memory system comprises first through n-th memory chips and a memory controller. Each of the first through n-th memory chips comprises a plurality of multi-bit nonvolatile memory cells. The memory controller comprises first through m-th buffer memories and first through m-th backup memories corresponding to the first through m-th buffer memories. Each of the first through m-th backup memories is adapted to store i-bit data previously programmed in selected memory cells among the first through n-th memory chips before j-bit data is programmed in the selected memory cells.

According to still another embodiment of the invention, method of programming a nonvolatile memory system is provided. The nonvolatile memory system comprises a memory array including a plurality of multi-bit nonvolatile memory cells and a memory controller including a buffer memory and a backup memory. The method comprises programming i-bit data to selected memory cells in a first region of the memory array, storing the i-bit data in the backup memory, programming j-bit data to the selected memory cells, determining whether the j-bit data has been successfully programmed in the selected memory cells, and upon determining that a the j-bit data has not been successfully programmed in the selected memory cells, programming the i-bit data stored in the backup memory and the j-bit data stored in the buffer memory to memory cells in a second region of the memory array.

According to yet another embodiment of the invention, another method of programming a nonvolatile memory system is provided. The nonvolatile memory system comprises first through n-th memory chips, each including a plurality of multi-bit nonvolatile memory cells, and a memory controller including first through m-th buffer memories and first through m-th backup memories. The method comprises programming i-bit data to selected memory cells in a first region of one of the first through n-th memory chips, storing the i-bit data in one of the first through m-th backup memories, programming j-bit data to the selected memory cells, determining whether the j-bit data has been successfully programmed in the selected memory cells, and upon determining that the j-bit data has not been successfully programmed in the selected memory cells, programming the i-bit data and the j-bit data to memory cells in a second region in one of the first through n-th memory chips.

BRIEF DESCRIPTION OF THE DRAWINGS

Embodiments of the invention are described in relation to the accompanying drawings. Throughout the drawings like reference numbers indicate like exemplary elements, components, and steps. In the drawings:

FIG. 4 is a threshold voltage distribution diagram illustrating one type of programming operation for nonvolatile memory cells in a nonvolatile memory system;

FIG. 5 is a threshold voltage distribution diagram illustrating another type of programming operation for nonvolatile memory cells in a nonvolatile memory system;

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

In general, embodiments of the invention provide nonvolatile memory systems and associated methods adapted to prevent data already stored in multi-bit nonvolatile memory cells from being lost when the multi-bit nonvolatile memory cells are further programmed. For example, selected embodiments of the invention provide a memory controller including a backup memory for storing a backup copy of the data already stored in the multi-bit nonvolatile memory cells when the memory cells are further programmed.

Selected embodiments of the invention are described below in relation to nonvolatile memory systems including 2-bit memory cells. However, these embodiments could be readily modified to function with nonvolatile memory systems including n-bit cells, where n is an integer greater than 2. In addition, in several disclosed embodiments, a least significant bit of memory cells is programmed before a most significant bit of the memory cells. However, the order of programming can also be readily modified. Moreover, those skilled in the art will recognize that a wide variety of additional modifications can be made to the exemplary embodiments described below without departing from the scope of the invention. Finally, many of the well know functions, variations, and nuances of nonvolatile memory systems have been intentionally simplified or omitted from this description where their description is not presently necessary to enable one skilled in the art to make and use the various embodiments of the invention.

Figure 1:
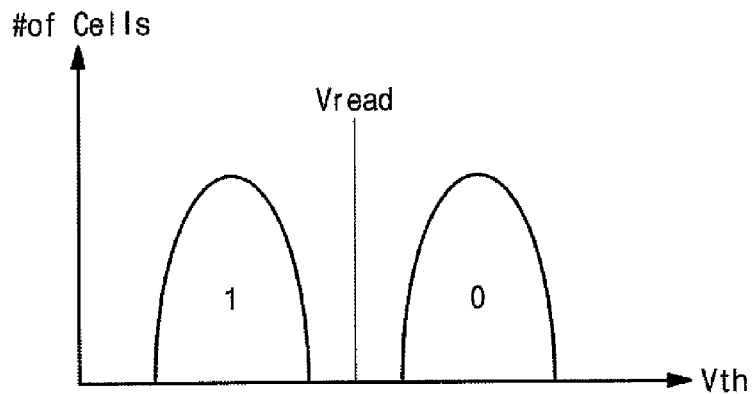
FIG. 1 is a graph illustrating two distinct threshold voltage distributions used to store data in a single level flash memory cell.
Figure 2:
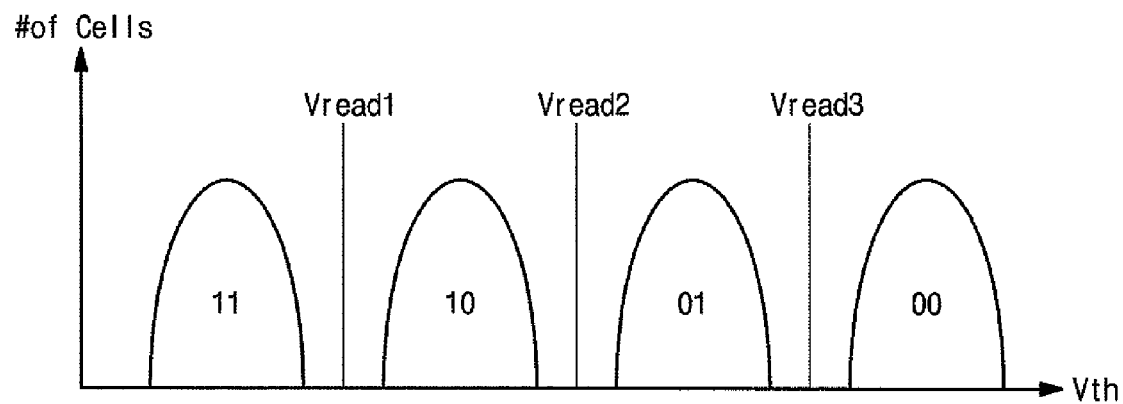
FIG. 2 is a graph illustrating four distinct threshold voltage distributions used to store data in a multi-level flash memory cell.
Figure 3:
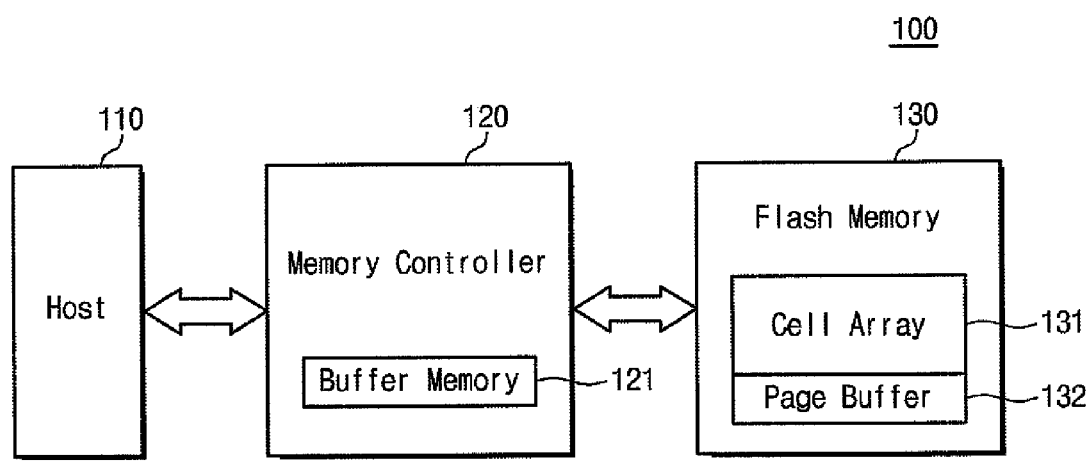
FIG. 3 is a schematic block diagram illustrating a conventional nonvolatile memory system.
Figure 6:
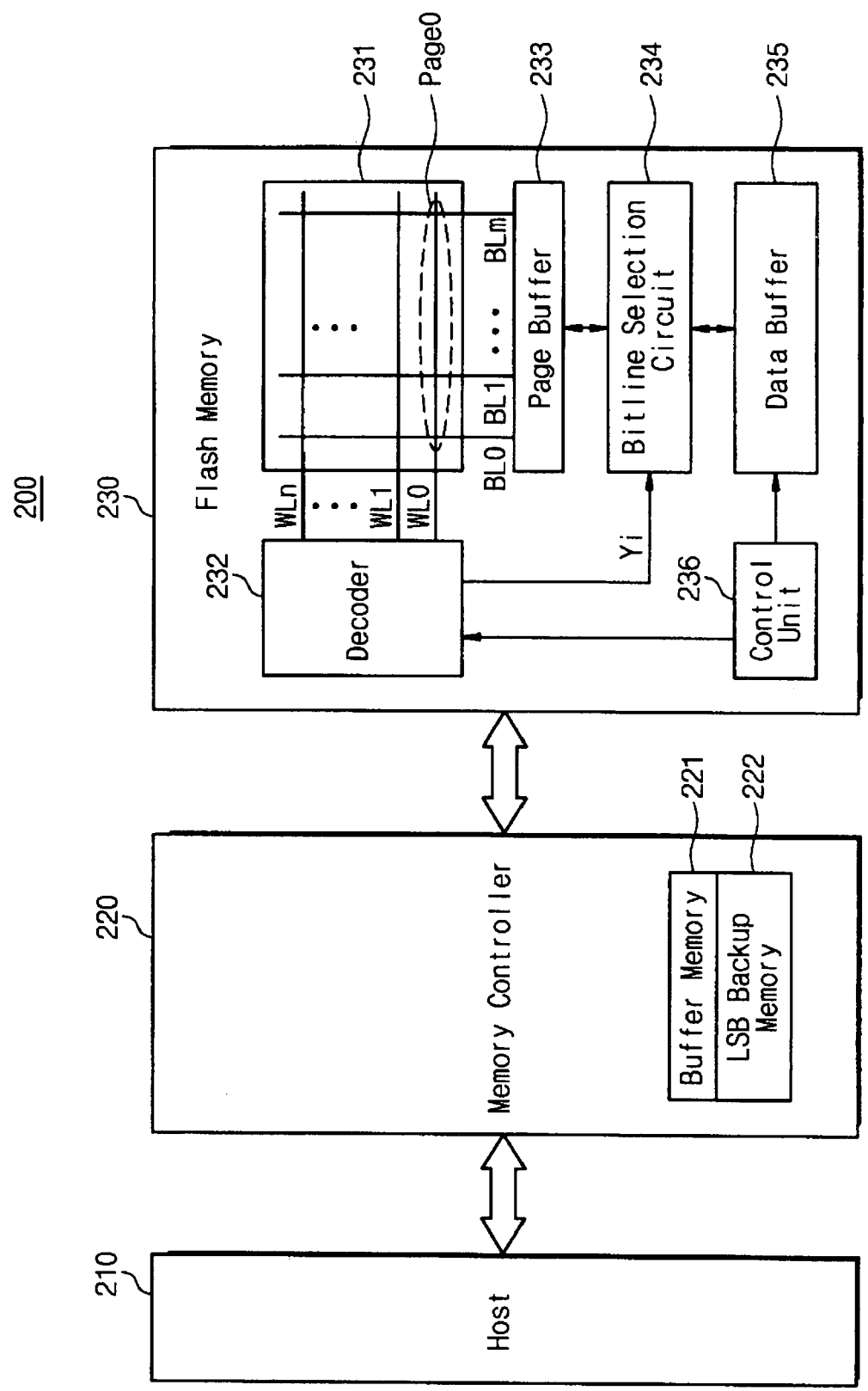
FIG. 6 is a schematic block diagram illustrating a nonvolatile memory system according to an embodiment of the invention.

FIG. 6 is a schematic block diagram illustrating a nonvolatile memory system according to an embodiment of the invention.

Referring to FIG. 6, a nonvolatile memory system 200 comprises a host 210, a memory controller 220, and a flash memory 230. Memory controller 220 comprises a buffer memory 221 and a least significant bit (LSB) backup memory 222. Flash memory 230 comprises a memory cell array 231, a decoder 232, a page buffer 233, a bitline selection circuit 234, a data buffer 235, and a control unit 236.

In memory controller 220, buffer memory 221 temporarily stores data to be programmed in flash memory 230 during program operations. Buffer memory 221 also temporarily stores data read from flash memory 230 during read operations. Buffer memory 221 operates under the control of memory controller 220 and receives data from host 210 and transfers data to flash memory 230 during program operations, and receives data from flash memory 230 and transfers data to host 210 during read operations.

LSB backup memory 222 stores data that has already been stored in selected memory cells of flash memory 230 before program data stored in buffer memory 221 is programmed to the selected memory cells. For example, during a program operation of the selected memory cells, buffer memory 221 may store MSB data to be programmed in the selected memory cells. Memory controller therefore controls flash memory 230 to transfer LSB data already stored in the selected memory cells in LSB backup memory 222. Because LSB backup memory 222 stores data that has already been programmed in the selected memory cells, and buffer memory 221 stores data yet to be programmed in the selected memory cells, if an error or malfunction occurs while programming the selected memory cells, any data lost from the selected memory cells can be recovered from buffer memory 221 and LSB backup memory 222. As a result, the presence of LSB backup memory 222 increases the reliability of nonvolatile semiconductor memory device 200 of FIG. 6.

In general, buffer memory 221 and LSB backup memory 222 can arranged in a single memory chip. For instance, memory controller 220 could store the data already programmed in the selected memory cells in a first region of a dynamic random access memory (DRAM) chip referred to as LSB backup memory 222, and memory controller 220 could store the data yet to be programmed in the selected memory cells in a second region of the DRAM chip referred to as buffer memory 221.

In flash memory 230, memory cell array 231 stores programmed data. Decoder 232 receives read and program addresses from memory controller 220 via control unit 236 and controls activation or selection of wordlines and bitlines for read and program operations in accordance with the read and program addresses. In the example of FIG. 6, decoder 232 is connected to memory cell array 231 via word lines WL0 through WLn, and produces a bitline selection signal Yi to control the activation or selection of bitlines for program and read operations by bitline selection circuit 234.

Page buffer 233 is connected to memory cell array 231 via bitlines BL0 through BLm and temporarily stores data to be programmed in memory cell array 231 in program operations and data read from memory cell array 231 in read operations. Bitline selection circuit 234 controls activation or selection of bitlines for programming and read operations based on bitline selection signal Yi. The selected or activated bit lines are driven to program or read the selected memory cells in memory cell array 231 based on the data stored in page buffer 233.

Data buffer 235 is an input/output buffer used to transfer data between memory controller 220 and flash memory 230. For example, in a read operation, data stored in selected memory cells is transferred from memory cell array 231 to data buffer 235 via page buffer 233 and bitline selection circuit 234. Next, the data is transferred from data buffer 235 to memory controller 220, and thereafter the data is transferred to host 210. In a program operation, on the other hand, data to be programmed in selected memory cells of memory cell array 231 is transferred from host 210 to memory controller 220 and thereafter to data buffer 235. Then, the data is transferred from data buffer 235 to page buffer 233 via bitline selection circuit 234, and thereafter, the data is programmed in the selected memory cells. Data buffer 235 operates under the control of control unit 236, which in turn operates in response to control signals produced by memory controller 220.

Memory cell array 231 comprises a plurality of multi-bit nonvolatile memory cells arranged in rows and columns. As an example, cell array 231 may comprise a NAND flash memory array including NAND flash memory cells arranged in a plurality of NAND strings. Typically, the columns of memory cell array 231 are connected to corresponding bitlines and the rows are connected to corresponding wordlines.

Each row of multi-bit nonvolatile memory cells connected to the same wordline in memory cell array 231 corresponds to one or more pages of data storage. For example, a page "Page0" is illustrated in FIG. 6 by a dotted oval. Memory cell array 231 is further arranged into a plurality of blocks, each comprising a plurality of pages. As a typical example, each page may include 512 bytes or 2 Kbytes of data and each block may include 32 or 64 pages of data.

Typically, though not necessarily, programming and read operations are performed on memory cell array 231 one page at a time and erase operations are performed a block at a time. As an alternative, for example, memory cell array 231 could also be programmed in units of one or more blocks at a time.

In the example of FIG. 6, the memory cells in memory cell array 231 are 2-bit nonvolatile memory cells. These memory cells are programmed by first programming a LSB and then later programming a MSB. The LSB and the MSB of each memory cell are not necessarily programmed in immediate succession. In other words, the LSB of a selected memory cell may be programmed first, followed by programming of other memory cells, followed by programming of the MSB of the selected memory cell. In the example of FIG. 6, the memory cells in memory cell array 231 are programmed and read one page at a time and erased one block at a time.

As described previously, the multi-level memory cells in the example of FIG. 6 and other embodiments could alternatively store more than two bits. For example, the memory cells could be 3-bit memory cells, 4-bit memory cells, and so on. In such memory cells adapted to store different numbers of bits, data to be stored in the memory cells can be referred to generally as 1-bit data, 2-bit data, 3-bit, data, and so on, as opposed to simply LSB data and MSB data as in the case of 2-bit memory cells. For instance, in a four bit memory cell storing a data string "0100", the bit "1" will be referred to as 3-bit data because it is in a third position in the string.

Also described previously, the multi-level memory cells in the example of FIG. 6 and other embodiments could be alternatively programmed in different orders. For instance, higher order bits (e.g., MSB data) could be programmed before lower order bits (e.g., LSB data). Moreover, the programming order could be further modified by rearranging the order of assignments between logic states and threshold voltage distributions, e.g., such as those illustrated in FIG. 5.

Figure 7:
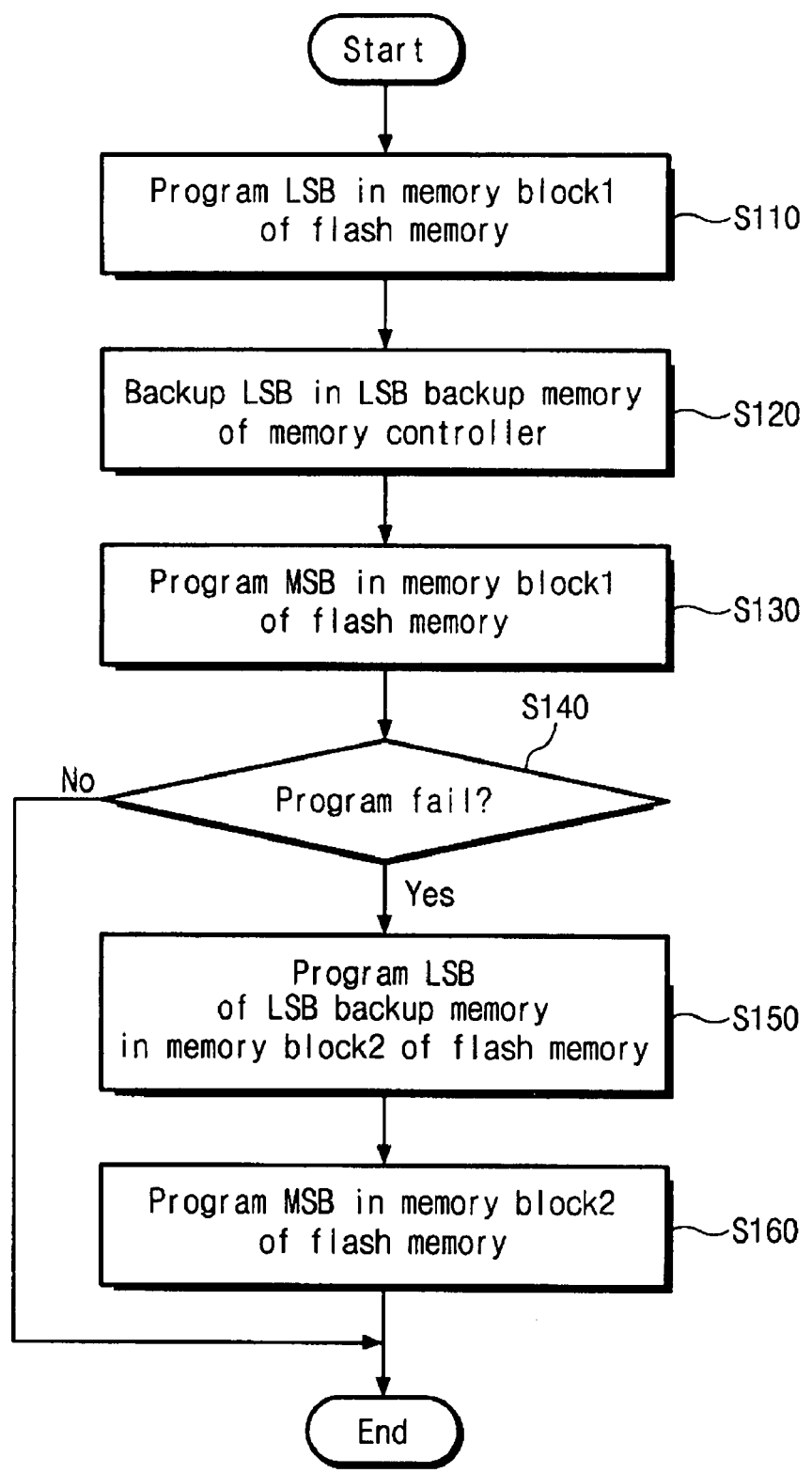
FIG. 7 is a flowchart illustrating a programming method for a nonvolatile memory system according to an embodiment of the invention.

FIG. 7 is a flowchart illustrating a method of programming nonvolatile memory system 200 illustrated in FIG. 6 according to an embodiment of the invention. Although the method illustrated in FIG. 7 relates to nonvolatile memory system 200, the method can be readily modified to function with various different nonvolatile memory systems according to other embodiments of the invention. In the description that follows, exemplary method steps will be denoted by parentheses (SXXX) to distinguish them from exemplary graphical and system elements such as those illustrated in FIGS. 1 through 5.

Referring to FIG. 7, memory controller 220 controls flash memory 230 to program a page of LSB data into selected memory cells of a first memory block block1 of memory cell array 231 (S110). After programming the LSB data in the selected memory cells, flash memory 230 typically performs a program-verify operation to determine whether the LSB data was successfully programmed in the selected memory cells. In the method of FIG. 7, it will be assumed that the LSB data is successfully programmed. In general, the method will not proceed until the LSB data is successfully programmed in the selected memory cells. After the page of LSB data is programmed into the selected memory cells, other programming operations may be performed for different memory cells in memory cell array 231 before MSB data is programmed into the selected memory cells.

Once the MSB data is about to be programmed into the selected memory cells, memory controller 220 controls flash memory 230 to back up the LSB data in the selected memory cells by transferring the LSB data to LSB backup memory 222 of memory controller 220 (S120). Once the LSB data from the selected memory cells is stored in LSB backup memory 222, a page of MSB data is programmed in the selected memory cells of first memory block block1 of flash memory 230. (S130).

After the LSB and MSB data have been programmed in the selected memory cells of block1 in steps S110 and S130, respectively, flash memory 230 performs a program-verify operation to determine whether the MSB data has been successfully programmed in the selected memory cells (S140). Where flash memory 230 determines that the MSB data has been successfully programmed in the selected memory cells, the method terminates, as indicated by an arrow labeled "No" (indicating no program failure) in FIG. 7. Otherwise, where flash memory 230 determines that the data has not been successfully programmed in the selected memory cells, memory controller 220 controls flash memory 230 to program the page of LSB data into a second memory block block2 in flash memory 230 (S150), and then memory controller 220 controls flash memory 230 to program the page of MSB data into second memory block block2 in flash memory 230 (S160). After the LSB and MSB data are successfully programmed in flash memory 230, the programming method of FIG. 7 terminates.

Figure 8:
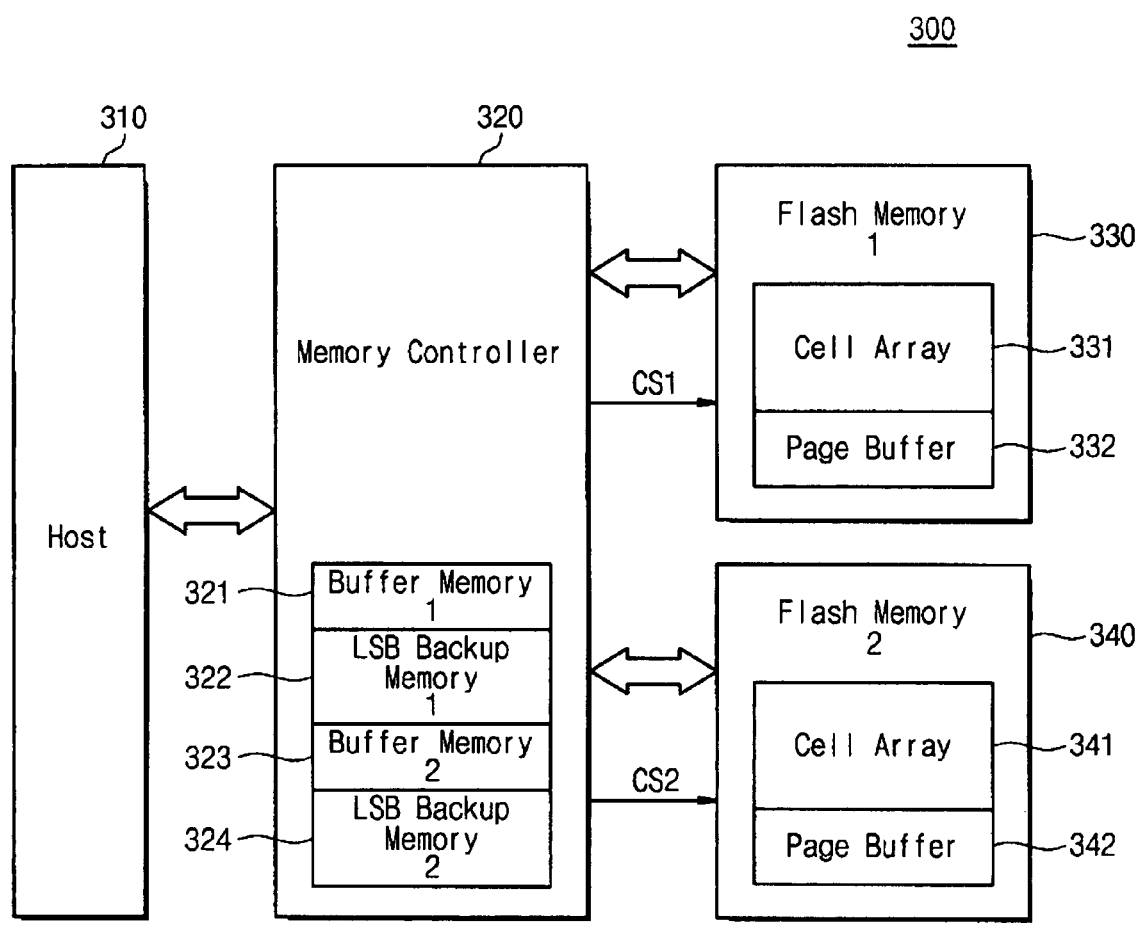
FIG. 8 is a schematic block diagram illustrating a nonvolatile memory system according to another embodiment of the invention; and, FIG. 9 is a schematic block diagram illustrating a nonvolatile memory system according to still another embodiment of the invention.

FIG. 8 is a schematic block diagram illustrating a nonvolatile memory system 300 according to another embodiment of the invention.

Referring to FIG. 8, nonvolatile memory system 300 comprises a host 310, a memory controller 320, and first and second flash memory chips 330 and 340. Memory controller 320 comprises a first buffer memory 321, a first LSB backup memory 322, a second buffer memory 323, and a second LSB backup memory 324. Typically, first and second buffer memories 321 and 323 and first and second LSB backup memories 322 and 324 are formed on a single chip such as a DRAM. First flash memory chip 330 comprises a first cell array 331 and a first page buffer 332 and second flash memory chip 340 comprises a second cell array 341 and a second page buffer 342.

In nonvolatile memory system 300, host 310 and memory controller 320 function similar to host 210 and memory controller 220 in FIG. 6, respectively. In addition, first and second flash memory chips 330 and 340 each function similar to flash memory 230 in FIG. 6. However, in memory controller 320, first buffer memory 321 and first LSB backup memory 322 each store data used for programming and reading first flash memory chip 330 and second buffer memory 323 and second LSB backup memory 324 each store data used for programming and reading second flash memory chip 340. Moreover, flash memory chip 330 functions in response to a first chip selection signal CS1 generated by memory controller 320 and flash memory chip 340 functions in response to a second chip selection signal CS2 generated by memory controller 320.

In a program operation of nonvolatile memory system 300, memory controller 320 first selects one of first and second flash memory chips 330 and 340 using first and second chip selection signals CS1 and CS2. Then, memory cells in the selected memory chip are programmed using a programming method such as that illustrated in FIG. 7. In other words, LSB data is first programmed into selected memory cells in a first block within the selected memory chip. Then, before MSB data is programmed into the selected memory cells in the first block, the LSB data is transferred into a LSB backup memory corresponding to the selected memory chip. Next, MSB data is programmed into the selected memory cells in the first block, and the selected memory chip then performs a program-verify operation to determine whether the MSB data was successfully programmed in those selected memory cells. Where the MSB data was successfully programmed in the selected memory cells, the program operation terminates. Otherwise, where an error or malfunction occurs during programming of the MSB data in the selected memory cells in the first block, the LSB data and the MSB data can be recovered from the LSB backup memory and the buffer memory corresponding to the selected memory chip and programmed in a second memory block in the selected flash memory chip or in the other flash memory chip.

Similarly, in a read operation of nonvolatile memory system 300, memory controller 320 selects first or second flash memory chip 330 or 340 according to an address of memory cells to be read. Then, the selected flash memory chip and memory controller 320 perform a read operation similar to that described above in relation to nonvolatile memory system 100 or 200.

Figure 9:
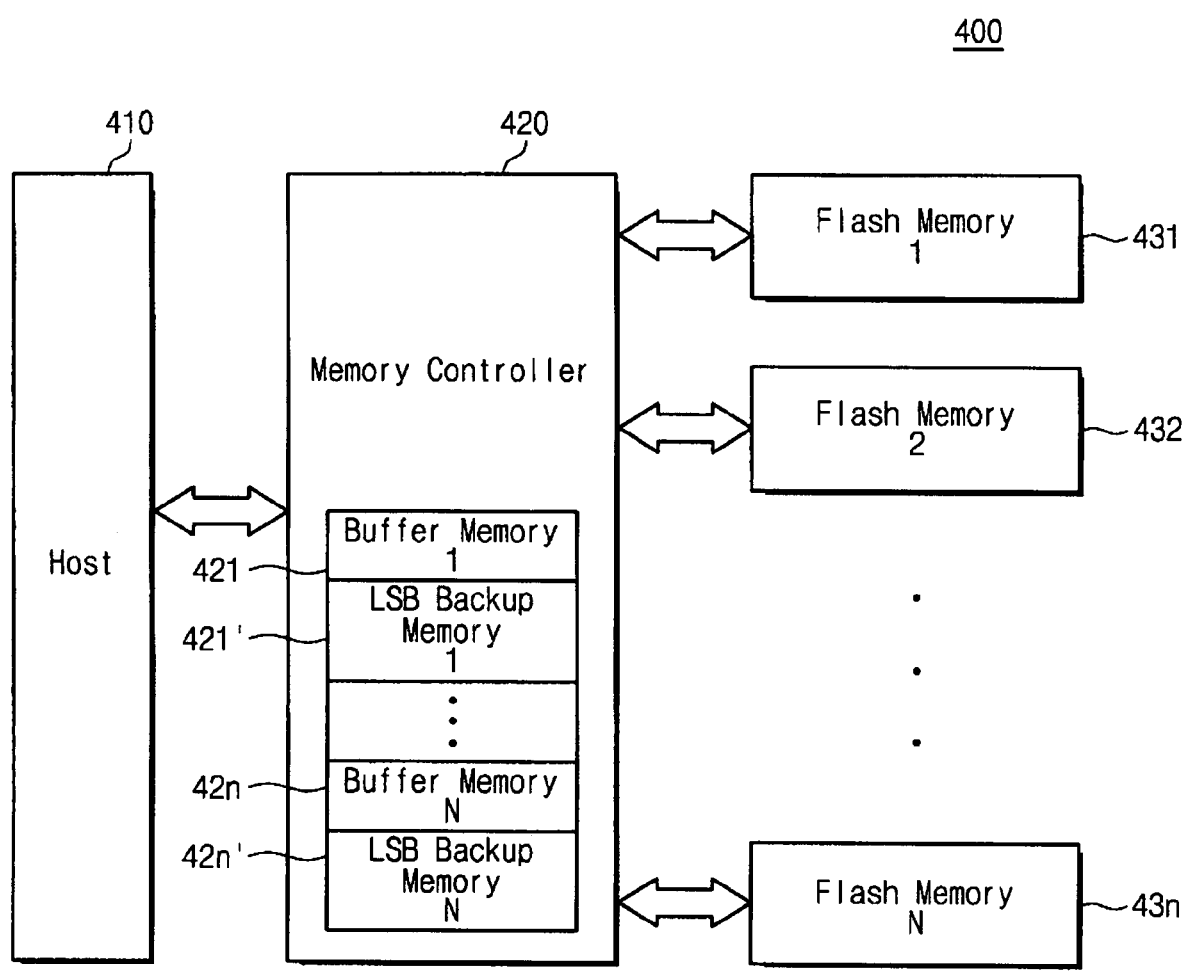

FIG. 9 is a schematic block diagram illustrating a nonvolatile memory system 400 according to still another embodiment of the invention. Nonvolatile memory system 400 is similar to nonvolatile memory system 300, except that nonvolatile memory system 400 can include an arbitrary number "n" of flash memory chips and corresponding buffer memories and LSB backup memories rather than two.

Referring to FIG. 9, nonvolatile memory system 400 comprises a host 410, a memory controller 420, and a plurality of flash memory chips 431 through 43n. Memory controller 420 includes a buffer memory and a LSB backup memory for each flash memory chip. More particularly, memory controller 420 includes buffer memories 421 through 42n and corresponding LSB backup memories 421" through 42n'. Typically, buffer memories 421 through 42n and LSB backup memories 421' through 42n' are formed on a single chip such as a DRAM.

In a program operation, nonvolatile memory system 400 selects one of flash memory chips 431 through 43n by activating (or deactivating) one of a plurality of corresponding chip select signals and then programs selected memory cells in the selected flash memory chip using a method similar to that described above in relation to nonvolatile memory system 300. Likewise, a read operation of nonvolatile memory system 400 may also be carried out in a manner similar to nonvolatile memory system 300 by selecting one of flash memory chips 431 through 43n and then reading data from the selected flash memory chip through a corresponding buffer memory in memory controller 420.

By providing backup memories for data already stored in selected multi-level memory cells, embodiments of the invention prevent data from being lost when the multi-level memory cells are further programmed. As a result, embodiments of the invention provide nonvolatile memory systems having improved reliability relative to conventional nonvolatile memory systems.

The foregoing exemplary embodiments are teaching examples. Those of ordinary skill in the art will understand that various changes in form and details may be made to the exemplary embodiments without departing from the scope of the invention as defined by the following claims.

What is claimed:

1. A nonvolatile semiconductor memory system, comprising:
   a memory array comprising a plurality of multi-bit nonvolatile memory cells; and
   a memory controller comprising:
   a buffer memory adapted to store j-bit data to be programmed in selected memory cells among the plurality of multi-bit nonvolatile memory cells; and
   a backup memory adapted to store i-bit data previously programmed in the selected memory cells before the j-bit data is programmed in the selected memory cells, wherein the i-bit data stored in the backup memory is read from the selected memory cells before the j-bit data is programmed in the selected memory cells.

2. The system of claim 1, wherein the buffer memory and the backup memory comprise different regions of a single memory chip.

3. The system of claim 2, wherein the single memory chip comprises a random access memory.

4. The system of claim 1, wherein the plurality of multi-bit nonvolatile memory cells are two-bit nonvolatile memory cells; and
   wherein the i-bit data is most significant bit (MSB) data and the j-bit data is least significant bit (LSB) data.

5. The system of claim 1, wherein the plurality of multi-bit nonvolatile memory cells are two-bit nonvolatile memory cells; and
   wherein the i-bit data is least significant bit (LSB) data and the j-bit data is most significant bit (MSB) data.

6. The memory system of claim 1, wherein the plurality of multi-bit memory cells are arranged in a row column matrix, and the memory system further comprises:
   a control unit adapted to control the memory system in response to a control signal from the memory controller;
   a decoder adapted to select a row of the matrix in response to the control signal and further adapted to output a selection signal;
   a bitline selection circuit adapted to select columns of the matrix in response to the selection signal;
   a data buffer adapted to receive data to be programmed in the selected memory cells from the memory controller; and,
   a page buffer adapted to store the data to be programmed in the selected memory cells.

7. The system of claim 1, wherein the i-bit data comprises a page of data and the j-bit data comprises a page of data.

8. The system of claim 1, wherein the memory array comprises a NAND flash memory array having multi-bit cells.

9. The system of claim 1, wherein $j > i$.

10. The system of claim 1, wherein when the i-bit data is programmed in the selected memory cells, one or more of the selected memory cells assumes an intermediate threshold voltage state overlapping a read voltage of the respective one or more selected memory cells.

11. A nonvolatile semiconductor memory system, comprising:
    first through n-th memory chips, each comprising a plurality of multi-bit nonvolatile memory cells; and
    a memory controller comprising first through m-th buffer memories and first through m-th backup memories corresponding to the first through m-th buffer memories;
    wherein each of the first through m-th backup memories is adapted to store i-bit data previously programmed in selected memory cells among the first through n-th memory chips before j-bit data is programmed in the selected memory cells, and
    the i-bit data stored in the backup memory is read from the selected memory cells before the j-bit data is programmed in the selected memory cells.

12. The system of claim 11, wherein the memory controller controls data transfers between the first through m-th buffer memories and the first through n-th memory chips to allow interleaved program operations to be performed in the first through n-th memory chips.

13. The system of claim 11, wherein the memory controller is connected to the first through n-th memory chips via a plurality of interfaces to provide the memory controller with simultaneous access to the first through n-th memory chips.

14. The system of claim 11, wherein each of the first through n-th memory chips is programmed in response to a corresponding one of first through n-th chip selection signals.

15. The system of claim 11, wherein n is equal to m.

16. The system of claim 11, wherein the buffer memories and the backup memories comprise different regions of a single memory chip.

17. The system of claim 16, wherein the single memory chip comprises a random access memory.

18. The system of claim 11, wherein the plurality of multi-bit nonvolatile memory cells are two-bit nonvolatile memory cells; and
wherein the i-bit data is most significant bit (MSB) data and the j-bit data is least significant bit (LSB) data.

19. The system of claim 11, wherein the plurality of multi-bit nonvolatile memory cells are two-bit nonvolatile memory cells; and
wherein the i-bit data is least significant bit (LSB) data and the j-bit data is most significant bit (MSB) data.

20. The system of claim 11, wherein at least one of the first through n-th memory chips comprises a NAND flash memory chip having multi-bit cells.

21. The system of claim 11, wherein when the i-bit data is programmed in the selected memory cells, one or more of the selected memory cells assumes an intermediate threshold voltage state overlapping a read voltage of the respective one or more selected memory cells.

22. A method of performing a programming operation in a nonvolatile semiconductor memory system comprising a memory array including a plurality of multi-bit nonvolatile memory cells and a memory controller including a buffer memory and a backup memory, the method comprising:
programming i-bit data to selected memory cells in a first region of the memory array;
reading the i-bit data from the selected memory cells;
storing the read i-bit data in the backup memory;
programming j-bit data to the selected memory cells;
determining whether the j-bit data has been successfully programmed in the selected memory cells; and,
upon determining that a the j-bit data has not been successfully programmed in the selected memory cells, programming the i-bit data stored in the backup memory and the j-bit data stored in the buffer memory to memory cells in a second region of the memory array.

23. The method of claim 22, wherein the first region comprises a first memory block and the second region comprises a second memory block.

24. The method of claim 22, wherein the i-bit data is stored in the backup memory upon determining that the j-bit data is to be programmed in the selected memory cells.

25. The method of claim 22, further comprising:
upon determining that a the j-bit data has been successfully programmed in the selected memory cells, terminating the programming operation.

26. The method of claim 22, wherein the plurality of multi-bit nonvolatile memory cells are two-bit nonvolatile memory cells; and
wherein the i-bit data is most significant bit (MSB) data and the j-bit data is least significant bit (LSB) data.

27. The method of claim 22, wherein the plurality of multi-bit nonvolatile memory cells are two-bit nonvolatile memory cells; and
wherein the i-bit data is least significant bit (LSB) data and the j-bit data is most significant bit (MSB) data.

28. The method of claim 22, wherein the memory array comprises a NAND flash memory array having multi-bit cells.

29. A method of performing a programming operation in a nonvolatile semiconductor memory system comprising first through n-th memory chips, each including a plurality of multi-bit nonvolatile memory cells and a memory controller including first through m-th buffer memories and first through m-th backup memories, the method comprising:
programming i-bit data to selected memory cells in a first region of one of the first through n-th memory chips;
reading the i-bit data from the selected memory cells;
storing the read i-bit data in one of the first through m-th backup memories;
programming j-bit data to the selected memory cells;
determining whether the j-bit data has been successfully programmed in the selected memory cells; and,
upon determining that the j-bit data has not been successfully programmed in the selected memory cells, programming the i-bit data and the j-bit data to memory cells in a second region in one of the first through n-th memory chips.

30. The method of claim 29, wherein the first region comprises a first memory block and the second region comprises a second memory block.

31. The method of claim 29, wherein the i-bit data is stored in the one of the first through m-th backup memories upon determining that the j-bit data is to be programmed in the selected memory cells.

32. The method of claim 29, wherein the programming operation is part of an interleaved programming operation performed in relation to the first through n-th memory chips.

33. The method of claim 29, wherein the memory controller is connected to the first through n-th memory chips via a plurality of interfaces to provide the memory controller with simultaneous access to the first through n-th memory chips, and wherein the programming operation is one of multiple simultaneous program operations performed in relation to the first through n-th memory chips.

34. The method of claim 29, wherein at least one of the first through n-th memory chips comprises a NAND flash memory chip having multi-bit cells.

* * * * *